United States Patent
Schaper (10) Patent No.: US 6,255,600 B1
(45) Date of Patent: Jul. 3, 2001

(54) ELECTRONIC INTERCONNECTION MEDIUM HAVING OFFSET ELECTRICAL MESH PLANE

(75) Inventor: Leonard W. Schaper, Fayetteville, AR (US)

(73) Assignee: The Board of Trustees of the University of Arkansas, Little Rock, AK (US)

(*) Notice: Subject to any disclaimer, the term of this patent is extended or adjusted under 35 U.S.C. 154(b) by 0 days.

(21) Appl. No.: 08/924,097

(22) Filed: Sep. 5, 1997

Related U.S. Application Data (60) Division of application No. 08/396,447, filed on Feb. 28, 1995, which is a continuation-in-part of application No. 08/024,616, filed on Mar. 1, 1993, now Pat. No. 5,410,107.

(51) Int. Cl.[7] .................................................. H05K 1/11
(52) U.S. Cl. ...................... 174/255; 174/261; 361/778; 361/805
(58) Field of Search .................................... 174/250, 255, 174/258, 260, 261; 361/748, 778, 784, 792, 795, 803, 805

(56) References Cited

U.S. PATENT DOCUMENTS

| | | | |
|---|---|---|---|
| 2,870,400 | 1/1959 | Hickok, Jr. | 324/407 |
| 3,033,914 | 5/1962 | Acosta-Lleras | 174/254 |
| 3,846,166 | 11/1974 | Saiki et al. | 174/256 X |
| 4,330,684 | 5/1982 | Hayward | 174/254 |
| 4,353,040 | 10/1982 | Krumm et al. | 333/1 |
| 4,363,930 | 12/1982 | Hoffman | 174/255 |
| 4,522,449 | 6/1985 | Hayward | 361/775 |
| 4,675,717 | 6/1987 | Herrero et al. | 257/777 |
| 4,703,288 | 10/1987 | Frye et al. | 333/1 |
| 4,782,193 | 11/1988 | Linsker | 174/261 |
| 4,811,082 | 3/1989 | Jacobs et al. | 174/261 X |
| 4,855,537 | 8/1989 | Nakai et al. | 174/250 |
| 4,859,806 | 8/1989 | Smith | 174/261 |

(List continued on next page.)

FOREIGN PATENT DOCUMENTS

| | | |
|---|---|---|
| 0 026 807 | 4/1981 | (EP) . |
| 0 267 360 | 5/1988 | (EP) . |
| 0 308 714 | 3/1989 | (EP) . |
| 2 305 914 | 10/1976 | (FR) . |
| 1 504 097 | 3/1978 | (GB) . |
| 62-76544 | 5/1987 | (JP) . |

OTHER PUBLICATIONS

J.A. Dorler, et al., 'Effective' Full Dense Square Hatch Reference Planes for MLC Packaging, IBM Technical Disclosure Bulletin, vol. 26, No. 8, New York, pp. 4017–4018 (Jan., 1984).

(List continued on next page.)

*Primary Examiner*—Albert W. Paladini
(74) *Attorney, Agent, or Firm*—Miles & Stockbridge P.C.

(57) ABSTRACT

An electrical interconnection medium is provided having first and second overlying interconnection layers. Each interconnection layer includes parallel conductors, and the conductors of the first and second interconnection layers are oriented orthogonally to each other. The conductors can be interconnected to form at least two electrical planes, with the conductors of the electrical planes being substantially interdigitated on each interconnection layer, portions of each plane appearing on both layers. The interconnection medium advantageously is employed as a multichip module. A method of designing such an MCM includes providing arranged conductive regions in a spaced manner, cutting selected sections to form signal conductor paths, and then filling spaces between like power and ground conductors. Another embodiment provides arranging touching conductive regions, defining signal path areas along uniformly-spaced touching borders, and then carving away conductive material to form desirably positioned and spaced power, ground and signal conductors.

14 Claims, 10 Drawing Sheets

U.S. PATENT DOCUMENTS

| | | | |
|---|---|---|---|
| 4,866,507 | 9/1989 | Jacobs et al. | 174/258 |
| 4,908,735 | 3/1990 | Tsuneki | 361/774 |
| 4,927,983 | 5/1990 | Jones et al. | 174/258 |
| 4,956,749 | 9/1990 | Chang | 361/795 |
| 5,165,166 | 11/1992 | Carey | 174/261 X |
| 5,272,600 | 12/1993 | Carey | 361/792 |
| 5,285,018 | 2/1994 | Pence, IV | 174/261 |
| 5,288,949 | 2/1994 | Crafts | 174/250 |
| 5,315,485 | 5/1994 | Magill et al. | 361/767 |
| 5,412,537 | 5/1995 | Magill et al. | 361/777 |
| 5,446,243 | 8/1995 | Crowder et al. | 174/250 |
| 5,585,602 | 12/1996 | Bernstein | 174/262 |
| 5,633,479 | 5/1997 | Hirano | 174/255 |
| 5,764,489 | 6/1998 | Leigh et al. | 361/777 |

OTHER PUBLICATIONS

B. Cabon, et al., Propagation Impedance of Transmission Lines on Perforated Group Planes for Multichip Packages, Int'l. Journal of Microcircuits & Electronic Packaging, vol. 16, No. 1, $1^{st}$ Qtr. 1993 (ISSN 1063–1674).

B. McWilliams, Comparison of Multichip Interconnect Technique, IEPS.

R.R. Tummala, et al., Multichip Packaging Technologies in IBM for Desktop to Mainframe Computers, $42^{nd}$ Electronic Corporate & Technology Conference, San Diego, May 18–20, 1992.

R. Schettler, Passive–Silicon–Carrier Design and Characteristics, $40^{th}$ ECTC, IEEE.

H. Hashami, et al., Electrical Chzracteristics of REduced Metal Layer Copper–Polymide Multi–Chip Module Substrate, Microelectronics & Computer Technology Corp. (MCC), Sep., 1992.

Y.L Low, L.W. Schaper, S. Ang and M. Ahmad, "Theory and Experimental Confirmation of the Interconnected Mesh Power System (IMPS) MCM Topology," Proc. International Electronics Packaging Conference, Sep. 1994, pp. 462–469.

L.W. Schaper, S. Ang and Y.L. Low, "Design of the Interconnected Mesh Power System (IMPS) MCM Topology," MCM '94 Proceedings, Apr. 1994, pp. 543–548.

Yee L. Low, Leonard W. Schaper and Simon S. Ang, "A Low–Cost MCM Topology—The Interconnected Mesh Power System (IMPS) MCM Topology," Proc. IEEE Multichip Module Conference, Jan. 31–Feb. 2, 1995.

L.W. Schaper, S. Ang, Y.L. Low and D. Oldham, "Electrical Characterizations of the Interconnected Mesh Power System (IMPS) MCM Topology," IEEE Transactions on CMPT, Part B, vol. 18. No. 1, Feb. 1995, pp. 99–105.

ELECTRONIC INTERCONNECTION MEDIUM HAVING OFFSET ELECTRICAL MESH PLANE

CROSS-REFERENCE TO RELATED APPLICATION

This application is a division of application Ser. No. 08/396,447 filed Feb. 28, 1995, which is a continuation-in-part of application Ser. No. 08/024,616 filed Mar. 1, 1993 (which is incorporated herein by reference in its entirety), now U.S. Pat. No. 5,410,107.

The U.S. Government has a paid-up license in this invention and the right in limited circumstances to require the patent owner to license others on reasonable terms as provided for by the terms of Grant No. MDA972-93-1-0036 awarded by the Advanced Research Projects Agency (APRA).

BACKGROUND OF THE INVENTION

The invention generally relates to integrated circuit chips and media for interconnecting same. More particularly, the invention relates to assemblies known as multichip modules (MCM) wherein unpackaged integrated circuit chips can be mounted on and wired to a substrate containing multiple patterned metal levels for power distribution and signal interconnection.

An MCM generally comprises a substrate on which are formed patterned conductive regions for the interconnection of circuit components, usually integrated circuit chips. The conductive regions are usually made of metal and formed in multiple levels, referred to herein as metal or interconnection levels or layers.

It is known that a substrate of an MCM can be fabricated of a variety of materials such as silicon, ceramic (for example, alumina), glass, or metal (for example, aluminum). It is also known that an interconnection level or layer can be formed on the substrate by depositing a conductive region on a given layer using techniques such as sputtering, evaporating, and in combination sputtering and plating. The conductive region then can be patterned into signal and power distribution conductors by photolithographic techniques combined with etching or selective plating. Multiple interconnection levels or layers can be formed so long as suitable interposing insulating layers are provided.

Interposing levels of insulating dielectric, i.e., insulating layers disposed between interconnection layers, can be applied by spinning, in the case of polymers, or chemical or physical vapor deposition, in the case of inorganics such as silicon dioxide. Holes (vias) patterned in these insulating layers by photolithography and wet or dry etching techniques allow interconnection from one level of metal to another.

An MCM substrate assembly as described above provides an interconnection medium for a plurality of chips that is more advantageous than, for example, printed circuit boards to which are mounted individually packaged chips, because it dramatically reduces the distance required for signals to travel between chips, and thus the time delay for inter-chip signal propagation. As integrated circuit technology has continued to advance to higher circuit speeds, this interconnection delay has become a major limitation on system performance, and thus has increased the importance of MCMs as interconnection media.

Also, for electronic systems, the use of an MCM and unpackaged chips advantageously results in far greater packing density of chips, and thus reduced system size.

A disadvantage of present MCM packaging and interconnection systems has been the high cost of MCM fabrication. The fabrication process is similar to that for integrated circuits (IC), and manufacturing equipment designed for integrated circuits generally has been used to fabricate MCMs, although an older generation of equipment generally can be used since MCM feature sizes are considerably larger than IC feature sizes. The manufacturing process of MCMs is essentially sequential, and the cost is roughly proportional to the number of photolithographic masks used in fabrication.

In this regard, it is common practice for MCM manufacturers to use at least four metal or interconnection levels, and thus eight or more masks, to provide for both power distribution and signal interconnections. Typically, there is one level each for a power plane, a ground plane, signals in the X direction, and signals in the Y direction. A mask is used for each level to pattern the conductive regions or conductors, and then another mask is used at each level to pattern the holes (vias) in the intervening dielectric to the next interconnection level.

The uppermost layer of an MCM usually is a dielectric which protects the entire structure, and whose pattern of openings to underlying conductive regions allows connections to be made between chips or the MCM package and the substrate itself by means of wire bonds, solder bumps, or other interconnection means.

In some MCM manufacturing technologies, additional masks are required for top level metallization compatible with wire bond or solder interconnect processes. It is also common to include some form of capacitor dielectric for decoupling purposes between the large area power and ground planes, and this dielectric must be patterned with yet another mask. All of these mask levels contribute to fabrication complexity and cost, and each manufacturing step in some incremental manner contributes to the inevitable yield loss due to manufacturing defects.

The combined maximum wiring density in a set of MCM signal planes generally can exceed 2,000 inches of wire per square inch of substrate. Yet, except in areas of the highest wiring congestion, most MCM designs use only a fraction of the available wiring capacity on the signal planes.

It is known that a pair of solid power distribution planes, one plane for power and one plane for ground, form an extremely low inductance power distribution system for relatively noise-free power delivery to semiconductor chips. It is also known that sandwiching a thin layer of dielectric material between these planes creates a distributed decoupling capacitor with very good high frequency characteristics. For example, see U.S. Pat. No. 4,675,717, the disclosure of which is incorporated herein by reference. Further, advances in discrete capacitor technology have resulted in decoupling capacitors with extremely low internal inductance. The use of these capacitors with a pair of power distribution planes also can result in a relatively noise-free power distribution environment. For example, see Tummala, et al. "Ceramics Packaging with Ferroelectric Decoupling Capacitor", *IEEE International Symposium on Applications of Ferroelectrics,* 1990, pp. 28–30, the disclosure of which is fully incorporated herein by reference.

It is also known that a solid power distribution plane can be perforated with an array of holes with little change in the electrical characteristics thereof. Such planes are commonly used in MCMs on layers which overlay polymer dielectrics, to allow outgassing of the polymer during curing. The resulting structure is known as a mesh plane.

Further, both power and ground potentials can be distributed on one physical layer by means of a technique referred to as interdigitation. In interdigitation, long, thin conductive regions are provided on one layer for carrying power and ground potentials or signals. The power and ground regions are, for example, alternately arranged so that every other region carries power potentials or signals while the interposing regions carry a ground potential. In this technique, however, if the conductors are long and thin, parasitic inductance and resistance detrimental to noise-power-free distribution are introduced. See H. Schettler, "Passive-Silicon-Carrier Design and Characteristics", 40th *Electronic Components and Technology Conference*, Las Vegas, May 20–23, 1990, pp. 559–561.

SUMMARY OF THE INVENTION

The present invention provides an interconnection medium wherein the number of interconnect layers is reduced while the low inductance power distribution characteristics of parallel power and ground planes, as well as the high wiring density for signal interconnect wires characteristic of photolithographic fabrication techniques are retained.

To that end, the present invention inventively combines aspects of mesh planes and interdigitation to create what is referred to herein as dual offset mesh planes or an interconnected mesh power system. The word "dual" denotes the provision of both power and ground planes. The word "offset" denotes the appearance of conductive regions of one electrical plane on two different interconnect layers.

As explained below, in a single offset mesh plane, all X direction conductors are carried on a first metal layer, and all Y direction conductors are carried on a second metal layer. At each point where these conductive regions overlie one another, they can be interconnected by means of a conducting hole or via through the dielectric separating the two metal layers. These conductive regions thus can define one electrical plane. Another plane can be incorporated into the structure by interdigitating in both metal levels a conductive region of opposite polarity between every conductor region of the first plane, and similarly connecting the overlying regions with vias to provide two offset mesh planes. Thus, the two metal levels can contain the electrical equivalent of two mesh planes, with the critically important topological feature that all conductive regions (i.e., conductors) lying in a given metal layer run in the same direction.

These features allow signal conductors to be effectively woven into a fabric of power and ground conductors. During the design process, when a signal path must be included between two points, the designer can determine the necessary X and Y conductors which must be included in the signal path and then isolate portions of the power and/or ground conductors on the metal layers necessary to provide a signal path. Of course, this process can be automated-specifically, computer-implemented-with the use of a computer aided design (CAD) system.

To this end, the present invention provides a method of forming a multichip module by computer-implemented design, which includes providing a first planar layer having a plurality of first groups of conductive regions arranged in a parallel, interdigitated manner with a plurality of second groups of conductive regions. A second planar layer is provided having a plurality of third groups of conductive regions arranged in a parallel, interdigitated manner with a plurality of fourth groups of conductive regions. The conductive regions in the second layer run generally perpendicularly to the conductive regions of the first layer. A section of at least one selected conductive region is removed to form at least one signal conductor.

In an embodiment, the conductive regions are initially spaced from one another.

In an embodiment, respective spaces between like conductive regions of the first and third groups are filled with conductive material after the removing step. This forms a single contiguous ground conductor from each first and third group. Also, spaces between conductive regions of the second and fourth groups are filled with conductive material after the removing step, forming a single contiguous power conductor from each second and fourth group. These spaces are not filled adjacent to each signal conductor, such that each signal conductor is spaced from adjacent power and ground conductors.

In an embodiment, each group is a pair.

In an embodiment, a plurality of vias is provided to connect overlapping junctions of conductive regions of the first groups and conductive regions of the third groups. Also, a plurality of vias is provided to connect overlapping junctions of conductive regions of the second groups and conductive regions of fourth groups.

In an embodiment, at least one of the signal conductors is in the first layer and at least one of the signal conductors is in the second layer. At least one via is provided to join (connect) an overlapping junction of the signal conductor in the first layer and the signal conductor in the second layer. It should be understood that those steps of "removing" and "filling" are performed in the computer aided design (CAD) system, not on a physical device.

In another embodiment, a method of forming a multichip module by computer-implemented design is provided, including providing a first planar layer having a plurality of first conductive regions arranged in a parallel, interdigitated manner with a plurality of second conductive regions such that edges of adjacent first and second conductive regions touch each other. A second planar layer includes a plurality of third conductive regions arranged in a parallel, interdigitated manner with a plurality of fourth conductive regions such that edges of adjacent third and fourth conductive regions touch each other. The conductive regions in the second layer run generally perpendicularly to the conductive regions in the first layers. Areas are then defined along selected borders of the touching edges, representing desired signal conductor paths. Conductive material is then removed from the conductive regions to form a space between adjacent conductive regions and a space between each area and adjacent conductive region.

The present invention also provides an improved MCM which can be constructed according to the preceding method. To this end, an electrical interconnection medium is provided including first and second interconnecting layers. Each layer has a plurality of parallel isolated signal conductive regions and interdigitated first and second conductive regions. At least one of the layers has a plurality of uniformly spaced parallel longitudinal axes throughout the layer. Each axis is located centrally between adjacent first and second conductors. Each of the isolated signal conductors is aligned on one of the axes.

In an embodiment, the conductive regions of the second layer are oriented orthogonally to the conductive regions of the first layer.

In an embodiment, the first conductive regions of the first and second layers are electrically interconnected at overlapping junctions by vias to form a power plane. Also, the second conductive regions of the first and second layers are electrically interconnected at overlapping junctions by vias to form a ground plane.

In an embodiment, the isolated signal conductive regions of the first and second layers are electrically connected at selected overlapping junctions.

The present invention also provides a computer-implemented design method for forming a multichip module which has two distinct power grids as well as a ground mesh and signal conductors. For example, one of the power grids could deliver 5V and the other could deliver 3.3V. To this end, in an embodiment, a method of forming a dual power grid multichip module includes providing a first planar layer having a plurality of first groups of conductive regions arranged in a parallel, interdigitated, sequential manner with a plurality of second groups and third groups of conductive regions. A second planar layer is provided having a plurality of fourth groups of conductive regions arranged in a parallel, interdigitated, sequential manner with a plurality of fifth groups and sixth groups of conductive regions. The conductive regions in the second layer run generally perpendicularly to the conductive regions in the first layer. A section of at least one selected conductive region is removed to form at least one signal conductor.

In an embodiment, the conductive regions are initially spaced from one another. In a related embodiment, respective spaces between like conductive regions of the first and fourth groups are "filled" after the removing step with conductive material, forming a single contiguous ground conductor from each first and fourth group. Respective spaces between like conductive regions of the second and fifth groups are "filled" after the removing step with conductive material, forming a single contiguous first power conductor from each second and fifth group. Respective spaces between like conductive regions of the third and sixth groups are "filled" after the removing step with conductive material, forming a single contiguous second power conductor from each third and sixth group. Each signal conductor is spaced from adjacent ground conductors and first and second power conductors. A plurality of vias are provided to connect overlapping junctions of conductive regions of the first and fourth groups. A plurality of vias are provided to connect overlapping junctions of conductive regions of the second and fifth groups. A plurality of vias are provided to connect overlapping junctions of conductive regions of the third and sixth groups.

In an embodiment, at least one signal conductor is formed in the first layer and at least one signal conductor is formed in the second layer. The method further includes providing at least one via to join an overlapping junction of the signal conductor in the first layer and the signal conductor in the second layer.

In an embodiment, a method of forming a dual power grid multichip module by computer-implemented design includes providing a first planar layer including a plurality of first conductive regions arranged in a parallel, interdigitated, sequential manner with a plurality of second conductive regions and third conductive regions such that borders of adjacent first, second and third conductive regions touch each other. A second planar layer is provided including a plurality of fourth conductive regions arranged in a parallel, interdigitated, sequential manner with a plurality of fifth conductive regions and sixth conductive regions such that borders of adjacent fourth, fifth and sixth conductive regions touch each other. The conductive regions in the second layer run generally perpendicularly to the conductive regions in the first layer. Signal path areas are defined along selected borders. Conductive material is removed from the conductive regions to form a space between adjacent conductive regions and a space between each signal path area and adjacent conductive regions. A plurality of vias are provided to connect overlapping first and fourth conductive regions. A plurality of vias are provided to connect overlapping second and fifth conductive regions. A plurality of vias are provided to connect overlapping third and sixth conductive regions. Also, at least one via is provided at a selected junction of the signal path areas.

These and other features of the present invention are set forth in greater detail in the following detailed description of the presently preferred embodiments and accompanying drawings.

DETAILED DESCRIPTION OF THE PRESENTLY PREFERRED EMBODIMENTS

As described above, the present invention provides a structure or medium for interconnecting semiconductor chips requiring only two metal levels. A description of the development of such a structure is described below.

Figure 1:
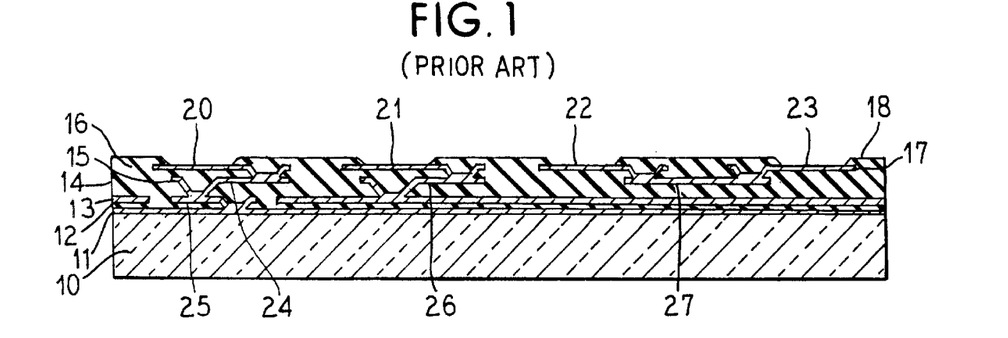
FIG. 1 illustrates a section of a conventional four-layer multichip module substrate.

In FIG. 1 there is illustrated a section of a conventional MCM interconnection medium having four metal layers. As illustrated, formed on a substrate 10 are a ground plane layer 11, a power plane distribution layer 13 and two signal layers 15 and 17, separated by various insulating layers 12, 14 and 16.

The substrate 10, can, for example, be made of silicon approximately 500 μm thick. The four metal layers 11, 13, 15 and 17 are formed on the substrate. A layer of silicon dioxide approximately 1 μm thick, not illustrated, is applied to the surface of the substrate 10 to insulate the first metal layer 11 from the semiconducting silicon layer 10. The layer 11 typically is a continuous ground plane made of sputtered aluminum approximately 2 μm thick.

Separating the ground plane 11 and the power distribution plane 13 is a thin layer of silicon dioxide 12, perhaps 1 μm thick. This layer of silicon dioxide can be applied by chemical vapor deposition and acts as an insulator and capacitor dielectric between the power plane 13 and the ground plane 11. Photolithographic techniques are used to pattern holes or vias wherever connections to the ground plane are to be made. These vias typically have a diameter on the order of 50 μm and have sloping sidewalls so that subsequent metal deposition achieves good sidewall coverage and reliable connection to the ground plane 11.

The power distribution layer 13 is applied in the same manner as the layer 11, and is likewise made of 2 μm thick aluminum. Isolated areas 25 of this power plane layer 13, which are used to make connections to the ground plane, are patterned by photolithography and wet chemical etching.

The dielectric layer 14 can consist of a 5 μm thick layer of silicon dioxide. Vias in this layer are used to allow connections to both the power layer 13 and the ground layer 11.

The metal signal layer 15 is applied over the dielectric layer 14. Signal conductors 27 in the X direction are patterned in this layer, as are ground connection regions 24 and power connection regions 26.

The dielectric layer 16 separates the two signal layers 15 and 17 and is patterned with many vias for making interconnections between the X and Y signal conductor segments as well as connections to the power layer 13 and ground layer 11. Signal vias provided in this layer 16 typically are smaller than the power vias and are approximately 10 to 20 μm in diameter.

The metal signal layer 17 is patterned to form Y direction signal conductors as well as all of the metal pads used to make connections to the chips connected thereto, for example by means of wire bonding. A typical ground pad 20 is illustrated, as well as a power pad 21 and two interconnected signal pads 22 and 23. The MCM is completed with the application and patterning of a dielectric layer 18 which protects the underlying layers from corrosion or mechanical damage. The layer 18 can be approximately 10 μm thick.

The foregoing description of a conventional MCM demonstrates the complexity and cost of fabrication required by the conventional four metal layer structure.

Figure 2:
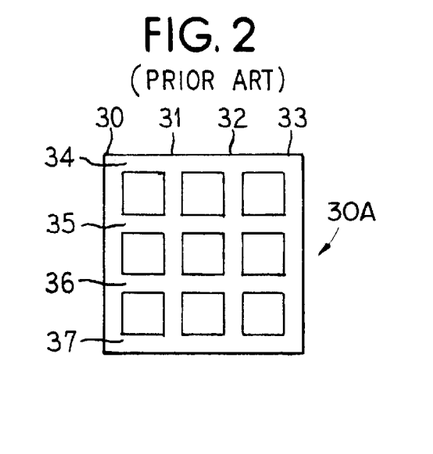
FIG. 2 illustrates X and Y conductive members of a conventional mesh plane.

In FIG. 2 there is illustrated a standard form of a mesh plane 30A, which is electrically functionally equivalent to a solid plane, except for an increase in sheet resistance proportional to the percentage of metal which is not present because of the design of the mesh. Mesh planes of this nature generally are used on upper levels of an MCM where an intervening dielectric layer is a polymer which outgases when cured. Horizontal (X) conducting members 34, 35, 36 and 37 connect to vertical (Y) conducting members 30, 31, 32 and 33.

The structure illustrated in FIG. 2 cannot be used to build a two level MCM, however, because any isolated signal conductor introduced onto the mesh would significantly reduce if not sever the connections between conducting members.

Figure 3:
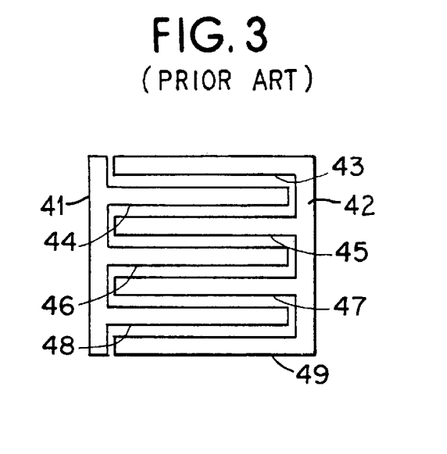
FIG. 3 illustrates an interdigitated power and ground structure on one metal layer.

In FIG. 3 there is illustrated the well-known single layer interdigitated power and ground distribution structure. The ground path in this structure is provided by conducting regions or conductors 41, 44, 46 and 48 and the power path is provided by conducting regions 42, 43, 45, 47 and 49. These various conductors allow power distribution to anywhere on the module and connections to chips by way of pads included on the power and ground conductors. As described in the Schettler article identified previously, this structure has been used to build MCMs, but the electrical distribution characteristics are undesirable for general use because of the high parasitic resistance and inductance in the long, thin conductors.

Figure 4:
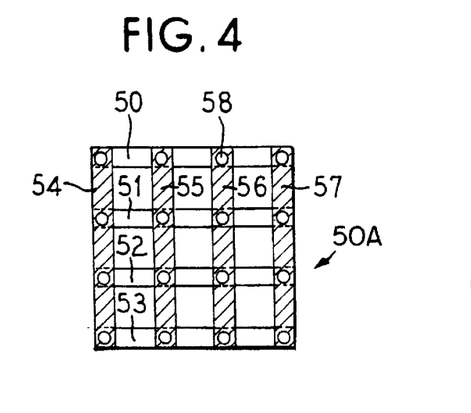
FIG. 4 illustrates an offset mesh plane embodying principles of the invention.

In FIG. 4 there is illustrated an offset mesh plane 50A, or at least a portion thereof. Conductive regions 50, 51, 52 and 53 typically can be 2 μm thick and 15 μm wide and spaced on 50 μm centers. All of these dimensions are typical of those that might be advantageous on a thin film MCM. The invention has general applicability for many interconnection media and thus these dimensions are for illustrative purposes only. These conductive regions 50, 51, 52 and 53 lie on a first physical metal layer.

Conductive regions 54, 55, 56 and 57 are of similar dimensions, but are formed on a second physical metal layer. Everywhere the conductors overlie each other, they are joined together by means of a via, such as via 58, which typically would be 10 μm in diameter through a 5 μm thick dielectric layer separating the first and second metal layers. As these vias have a low aspect ratio, they introduce very little parasitic inductance and resistance into the mesh, which otherwise is electrically equivalent to the mesh plane of FIG. 2.

The important topological difference between the mesh planes of FIG. 2 and FIG. 4 is that the long sections of conductors on either layer of the mesh plane of FIG. 4 can be removed without destroying the overall electrical characteristics of the mesh, so long as not too many wires are removed. For example, if the conductors 51, 53, 55 and 57 were removed, the result would still be an offset mesh plane, but with a line pitch of 100 μm instead of 50 μm. The parasitic resistance and inductance of the structure would be doubled, but the essentials of a planar distribution structure would be preserved.

It is the foregoing feature which allows the selective removal, within a computer aided design (CAD) system, at the design stage, of sections of the power distribution conductors (i.e., conductors of the power and ground planes) to provide room to include relatively sparse signal conductors. As long as mesh pitch remains electrically less in propagation time than 1/10th the signal rise time, no transmission line effects need to be taken into account; the mesh essentially will appear electrically as a solid plane. Alternatively, if a high performance power distribution system is not required, the conductors could lie at an even greater pitch, and no conductor segments would have to be removed to make room for signal paths.

Figure 5:
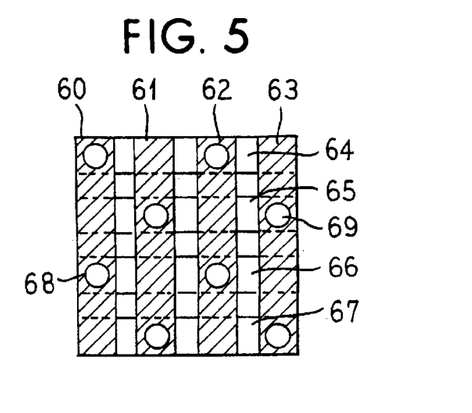
FIG. 5 illustrates the combination of two of the planes illustrated in FIG. 4 to produce a dual offset mesh plane.

In FIG. 5 there is illustrated a dual offset mesh planes structure embodying features of the invention. In the illustrated construction, distribution of both power and ground potentials by means of interdigitating respective conductors of two offset mesh planes is allowed. A 100 μm pitch of the conductors of the offset mesh plane of FIG. 4 allows space for these interdigitated conductors.

In the illustrated structure of FIG. 5, conductors 64 and 66 reside on a first metal layer and carry ground, while conductors 65 and 67 carry power. Similarly, conductors 60 and 62 reside on a second metal layer and carry ground, while conductors 61 and 63 carry power. Vias such as 68 join ground conductors at every intersection, while vias such as via 69 join power conductors.

It can be appreciated that in FIG. 5 only a very small dual offset mesh plane or section thereof is illustrated. It can be further appreciated that the structure illustrated in FIG. 5 can be expanded to be very large and that the illustrated pattern would continue over the entire extent of the power distribution system. As in the case of the single offset mesh plane of FIG. 4, isolated signal conducting regions can be introduced in the first and second metal layers during the design process, where required.

It can be appreciated that the power distribution system described in connection with FIG. 5 contains no provision for a distributed decoupling capacitor, as described in applicant's earlier U.S. Pat. No. 4,675,717. Instead, the necessary decoupling capacitance in the present system could be provided by discrete decoupling capacitors soldered or attached with conductive epoxy to interconnecting pads formed on the substrate. Recent advances in low inductance capacitor fabrication, such as described in the Tummala article identified above, allow this to be done in a manner which preserves a low power distribution impedance up to high frequencies.

Figure 6:
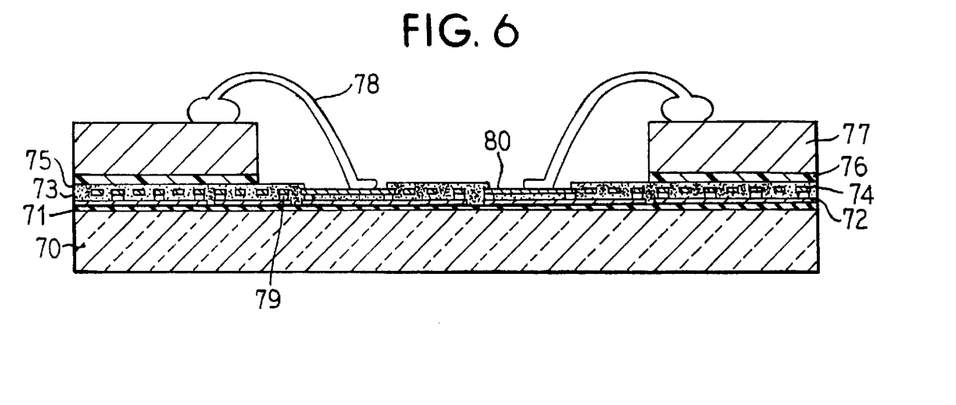
FIG. 6 illustrates a section of a multichip module substrate fabricated in only two metal levels.

In FIG. 6 there is illustrated a cross sectional view of an MCM structure embodying principles of the invention. In FIG. 6, base substrate 70 carries an unpatterned insulating layer 71 thereover. It can be appreciated that the unpatterned insulating layer 71 can be omitted if the substrate 71 itself is made of an insulating material.

Formed over the insulating layer 71 is a first metal layer 72. The first metal layer 72 is patterned using the same fabrication techniques as are used in forming a conventional MCM substrate. In the view illustrated in FIG. 6, conducting regions parallel to the plane of the figure (in the left-to-right direction) are carried in the layer 72.

A dielectric insulating layer 73 is deposited over the first metal layer 72 and is employed to separate the layer 72 from a second metal layer 74. The dielectric insulating layer 73 is perforated with vias such as the via 79 for the reasons set forth above.

The second metal layer 74, also patterned, carries conductors perpendicular to the plane of FIG. 6 and also includes pads such as the pad 80, used to interconnect chips, passive components, and an MCM package or other exterior connections.

Deposited over the layer 74 is another dielectric layer 75. The layer 75 is patterned to expose the connection pads, but otherwise protects the substrate from corrosion and mechanical damage. Layer 75 could be omitted under certain circumstances.

The illustrated regions 76 are die attachment materials such as epoxy used to mount semiconductor dies or other components to the substrate. Regions 77 are the dies themselves. Wire bonds 78 serve to connect the bonding pads on the dies 77 to corresponding ones in the substrate.

Figure 7:
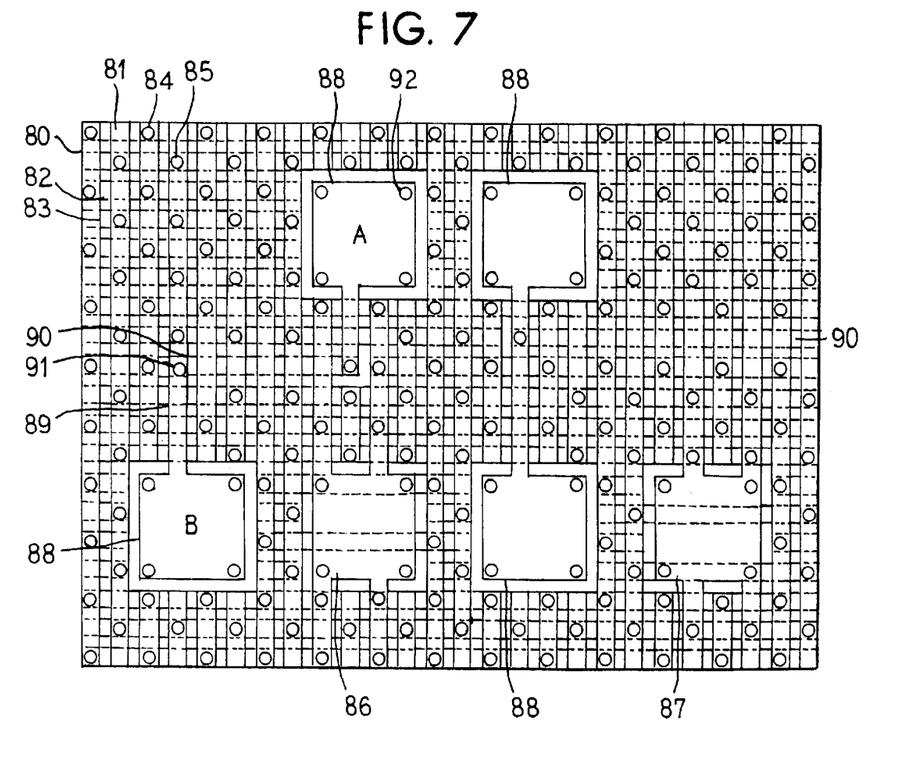
FIG. 7 illustrates a top view of a multichip module substrate showing power, grounds, and signal pads used for interconnecting semiconductor chips, as well as several signal traces woven into a power distribution mesh.

In FIG. 7 there is illustrated in plan view a dual offset mesh plane MCM. The view illustrated in FIG. 7 reveals how conductive regions for signal interconnection and pads for interconnecting the MCM substrate assembly to chips and to the MCM package are provided.

As illustrated, the ground mesh is provided by means of X conductors such as conductor 82 in the first metal layer, Y conductors such as the conductor 80 in the second metal layer, and vias such as the via 84 at every intersection of the ground conductors. Similarly, the power mesh is provided by means of X conductors such as the conductor 83 in the first metal layer, Y conductors such as the conductor 81 in the second metal layer, and vias such as the via 85 at every intersection of the power conductors.

It can be appreciated that the above structure can provide an electrical interconnection medium, comprising at least first and second interconnection layers, each of the interconnection layers comprising a plurality of parallel conductive regions, the conductive regions of the second interconnection layer being oriented orthogonally to the conductive regions of the first interconnection layer, the conductive regions of the first and second interconnection layers being electrically interconnected such that at least two electrical planes are provided and the conductive regions of the electrical planes are substantially interdigitated on each interconnection layer and portions of each electrical plane appear on both interconnection layers, and such that selective conductive regions can be electrically isolated from the two electrical planes to form at least one signal path.

The above structure also can provide a multichip module comprising a substrate; a first interconnection layer formed on the substrate, the first interconnecting layer comprising a plurality of parallel conductive regions; an insulating layer formed on the first interconnecting layer; and a second interconnecting layer formed on the insulating layer, the second interconnecting layer comprising a plurality of parallel conductive regions that are oriented orthogonally to the conductive regions of the first interconnecting layer; the conductive regions of the first and second interconnecting layers being interconnected such that at least two distinct electrical planes are provided and the conductive regions of the at least two electrical planes are substantially interdigitated in each interconnecting layer, and portions of each electrical plane appear on both interconnecting layers, and such that selected conductive regions can be electrically isolated from the at least two electrical planes.

Further, the structure can provide a multichip module comprising a substrate, having an insulating top surface, first and second interconnecting layers carried on the substrate, each interconnecting layer comprising a plurality of parallel conductive regions, the conductive regions of the second interconnecting layer being oriented orthogonally to the conductive regions of the first interconnecting layer, the conductive regions of the first and second interconnecting layers being interconnected such that at least two electrical planes are provided, the conductive regions of the electrical planes being substantially interdigitated on each of the interconnecting layers and such that portions of each electrical plane appear on each interconnecting layer, pads for connecting power, ground and signal conductors to electrical components, and a plurality of electrical components mounted on the pads.

As further illustrated in FIG. 7, pads are inserted into the dual offset mesh planes (i.e., formed thereon) as required for chip or external connections. To facilitate wire bonding, all pads can be 90 μm square on both metal layers, with four vias 92 in the corners thereof. A 10 μm guard band can separate the pad from the power distribution mesh.

Isolated signal pads 88 require a continuous guard band. To create a ground pad 86, all ground conductors which intersect the pad are allowed to remain. The power pad 87 similarly uses only the power conductors such as conductors 81 and 83 which would intersect the pad.

X direction signal conductors 90 in the first metal level and Y direction signal conductors 89 in the second metal level are inserted by means of a design system just as a normal router would insert wires into available wiring tracks. Each signal conductor segment so inserted must be surrounded by a guard band to insulate it from the power distribution mesh and must begin and end either in a via 91 to an orthogonal segment in the other metal level or at an isolated signal pad 88. All other vias which would short the signal line to portions of the power distribution system on the other metal plane would be removed by the CAD system.

Wiring rules similar to those used by conventional CAD systems to assign wires to wiring tracks can be used to limit the density of power mesh conductors removed during the signal conductor track assignment process.

Because of the fine pitch of the wires provided by the design rules, in this example, it is possible for the available signal wiring to be substantial. If every third power distribution wire were removed, leaving power and ground pairs of wires between each pair of signal wires, and if the basic wiring pitch were 25 $\mu$m, the available signal wiring density would still be 667 inches of wire per square inch of substrate. Removing only a third of the power distribution mesh is extremely conservative, so that signal wiring densities of 1,000 wires per square inch should easily be achieved with manufacturing processes in place today.

It should also be noted that signal conductors formed according to the principles described above will exist in a constant impedance environment, since all mesh conductors will be at alternating current ground and the holes in the mesh will be invisible to signals at practical frequencies of interest. The expected characteristic impedance of these lines will be higher than those in a stripline or a microstrip environment for the same dielectric dimensions, which is desirable so that dielectric layers can be thin. Crosstalk should be extremely low because of the shielding characteristics of the intervening power mesh conductors between signal lines.

Although emphasis herein has been placed on the application of the invention to thin film multichip modules, the principles of the invention are also applicable to other interconnection media such as printed wiring boards, ceramic multichip modules, fine line laminate-based multichip modules and even to semiconductor chips themselves. It is intended that the claims set forth hereinafter are to encompass such other modifications.

Further, although a construction in which all conductors are formed on one side of a substrate has been described, the principles of the invention are equally applicable if the two conducting layers were formed on opposite sides of a substrate, (which may also be a wafer, dielectric film, or other insulating medium, for example) through which the interconnecting vias are constructed.

It can be appreciated from the foregoing discussion that there can be provided a method of a multichip module by computer-implemented design, comprising steps of:
  providing a substrate;
  forming a first interconnecting layer on said substrate, said first interconnecting layer comprising a plurality of parallel conductive regions;
  covering the first interconnecting layer with an insulating layer;
  forming a pattern of conductive vias in said insulating layer; and
  forming a second interconnect layer over said insulating layer, the second interconnect layer comprising a plurality of conductive regions overlying and oriented orthogonal to the conductive regions of the first interconnect layer, the conductive regions in the conductive regions of the first and second interconnecting layers being electrically interconnected such that at least two electrical planes are formed, the conductive regions of the electrical planes being substantially interdigitated on each interconnecting layer, portions of each electrical plane appearing on both interconnecting layers.

Figure 8:
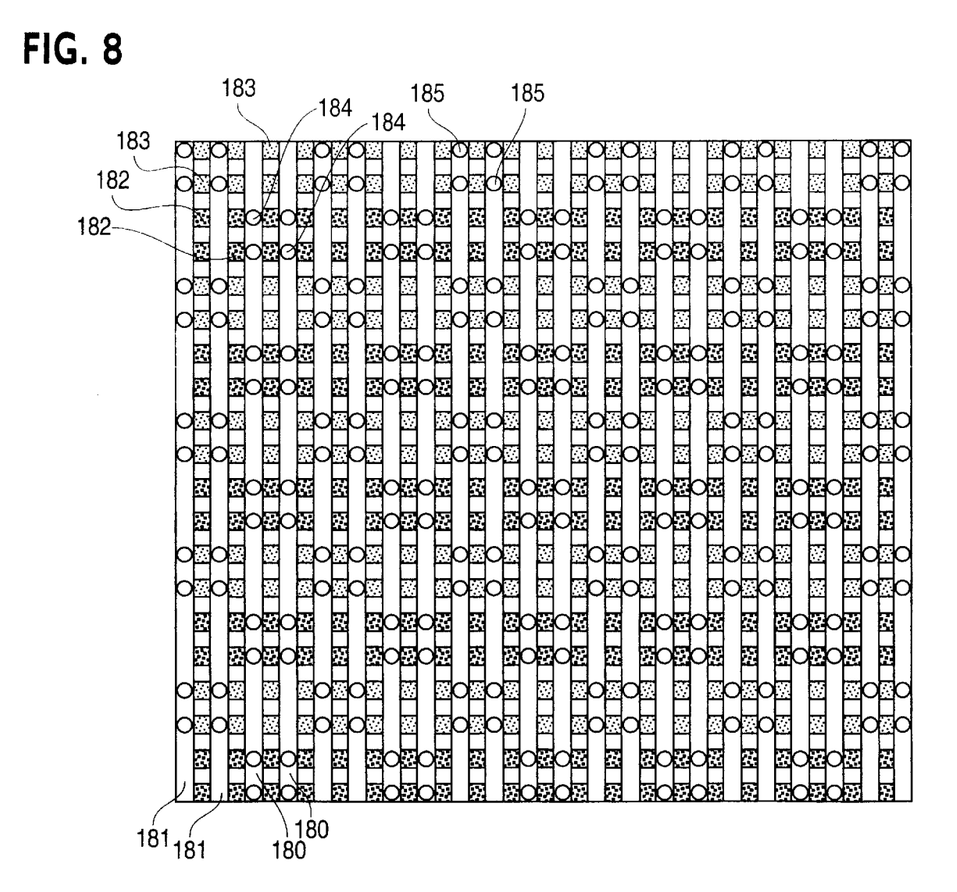
FIG. 8 illustrates a dual offset mesh plane according an embodiment of the present invention including alternating interdigitated pairs of power and ground conductors.
Figure 9:
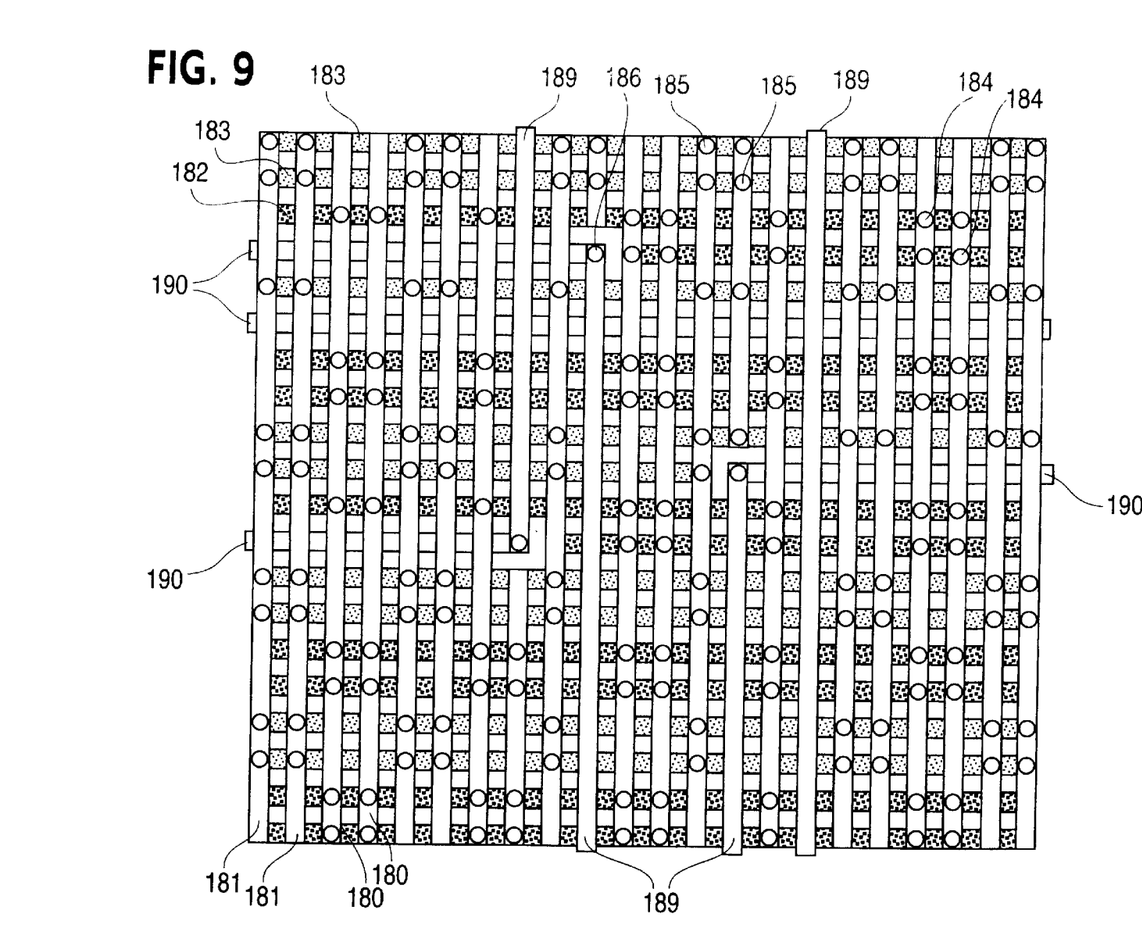
FIG. 9 illustrates the mesh plane of FIG. 8 with selected conductors converted to signal conductors.
Figure 10:
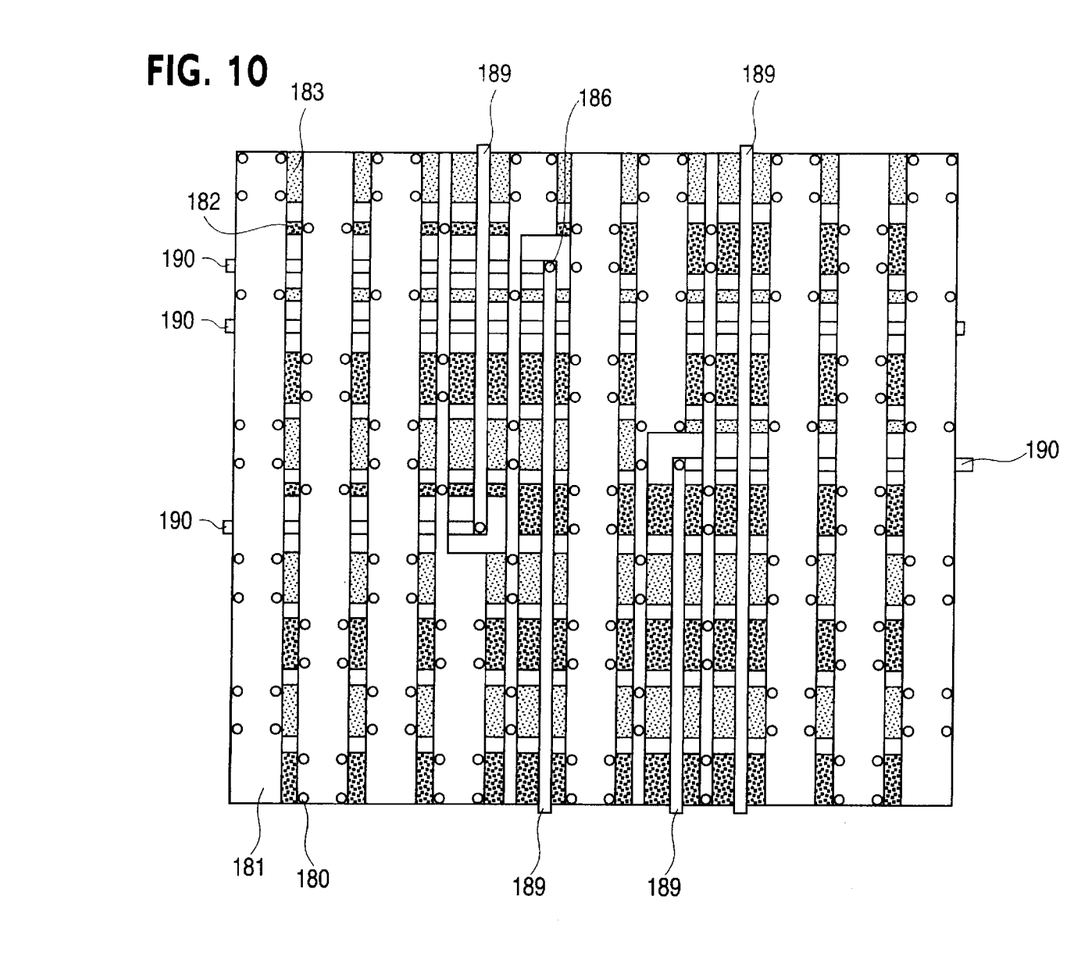
FIG. 10 illustrates the mesh plane of FIG. 9 having the areas between adjacent like conductors filled with conductive material.

Another method of designing an MCM according to the present invention is illustrated in FIGS. 8–10. Initially, in the CAD stage, the dual offset mesh plane structure of FIG. 8 is arranged to have alternating pairs of power and ground conductors at each level. The ground and power conductors could each be, for example, twenty (20) $\mu$m wide with a twenty (20) $\mu$m space between adjacent conductors.

Specifically, as illustrated, a ground mesh is provided by pairs of X ground conductors 182 in a first metal layer and pairs of Y ground conductors 180 in a second, upper metal layer. Also, a power mesh is provided by pairs of X power conductors 183 in the first metal layer and pairs of Y power conductors 181 in the second metal layer.

Given this initial mesh construction, selected ground conductors 180, 182 and/or power conductors 181, 183 of FIG. 8 are then converted into signal conductors. As shown in FIG. 9, sections of the X conductors 182 and/or 183 are removed to form X signal conductors 190, and sections of the Y conductors 180 and/or 181 are removed to form Y signal conductors 189. It should be understood that this represents an imaginary removal of material during a design stage of the CAD system. During this design stage, preferably, the right-most or lowermost conductor of a given pair of power or ground conductors is selected as that which is converted to a signal conductor. This configuration gives the signal conductors an 80 $\mu$m pitch. Turning to FIG. 10, the area between like conductors of the same plane are filled with conductive material. This is easily accomplished during CAD design.

Conductors of like polarity are connected together by vias. More specifically, as shown in FIG. 9, junctions of overlapping ground conductors 180, 182 are joined by vias 184, and overlapping power conductors 181, 183 are joined by vias 185. Also, vias 186 are placed at selected junctions of X and Y signal conductors 189, 190. The vias 184, 185 can be provided by CAD either in the initial mesh and selectively removed to allow proper signal conductor paths, or the vias 184, 185 could be provided at a subsequent design stage, such as after formation of the signal conductors 189, 190 or after the fill-in step.

Figure 11:
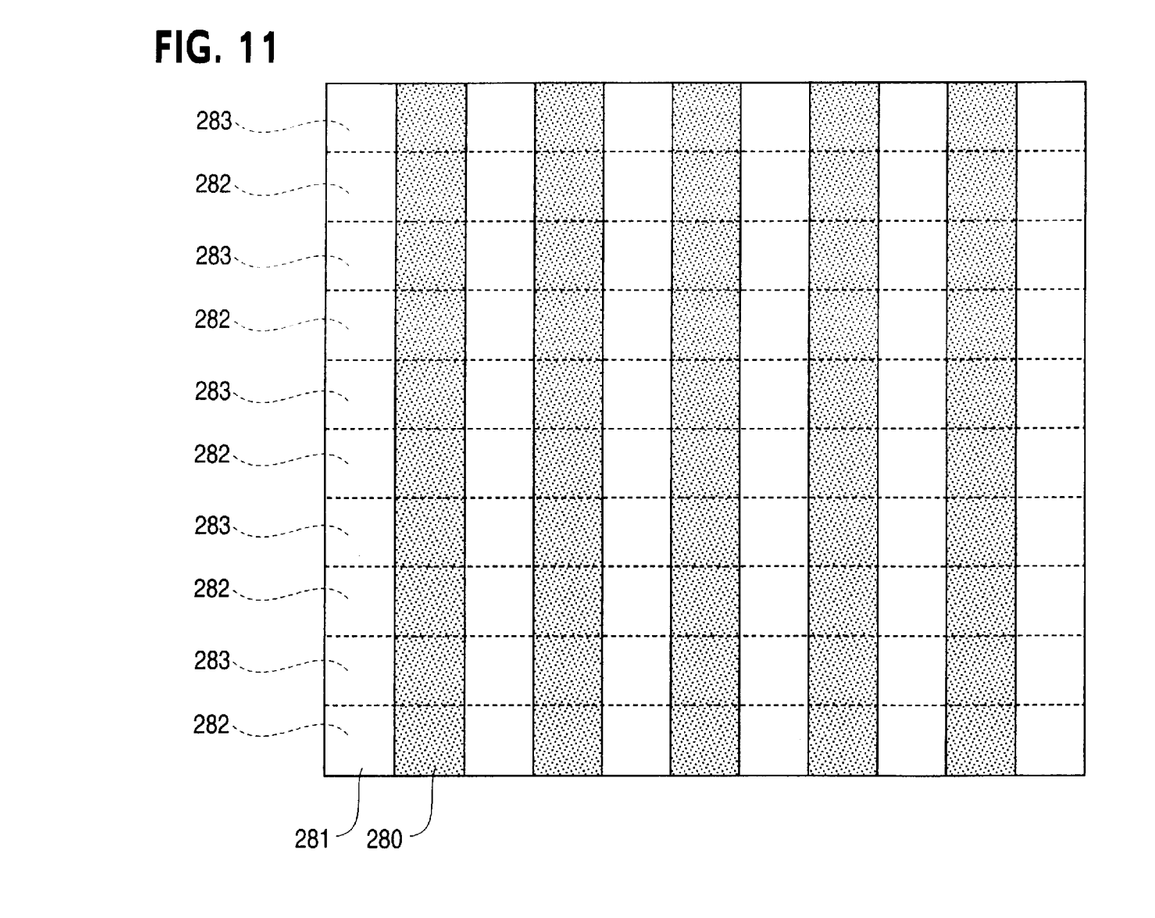
FIG. 11 illustrates an initial design stage of another mesh plane according to another embodiment of the present invention.
Figure 12:
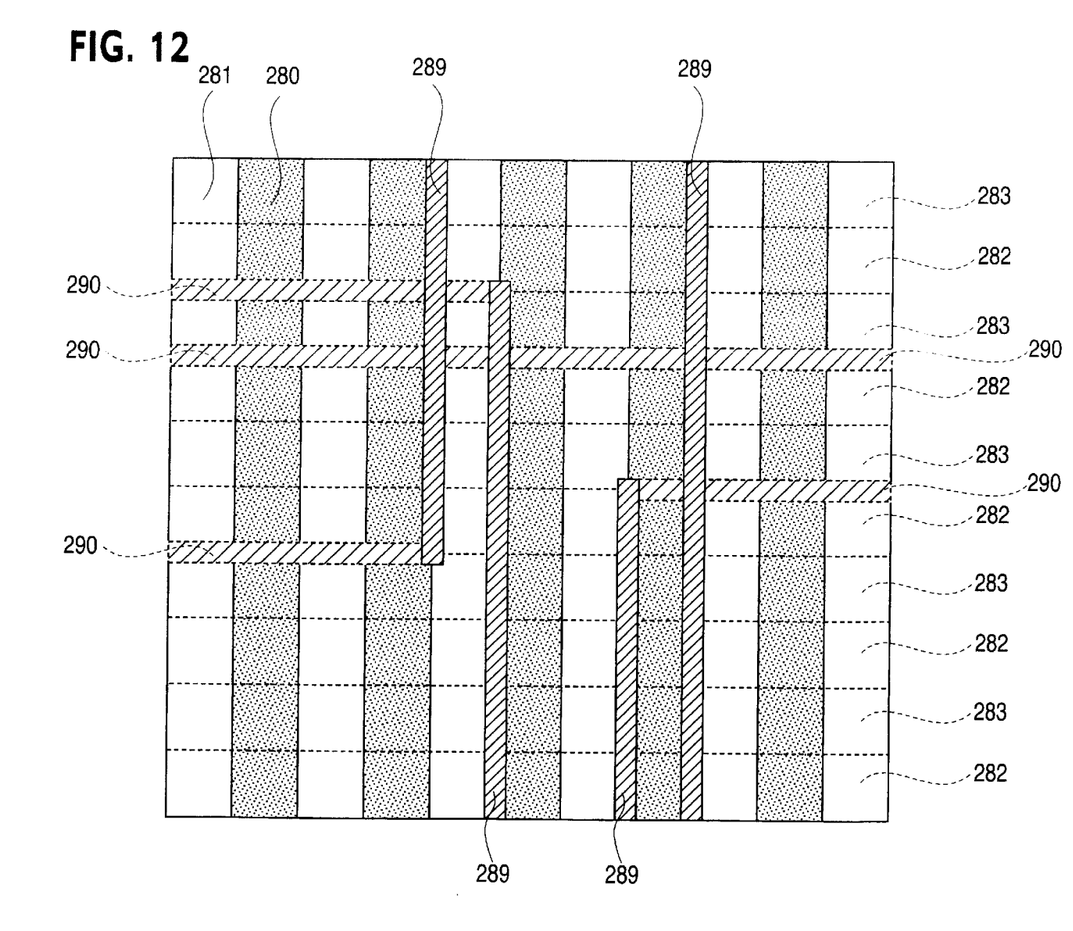
FIG. 12 illustrates the mesh plane of FIG. 11 having signal conductor paths defined along touching borders of adjacent power and ground conductors.
Figure 13:
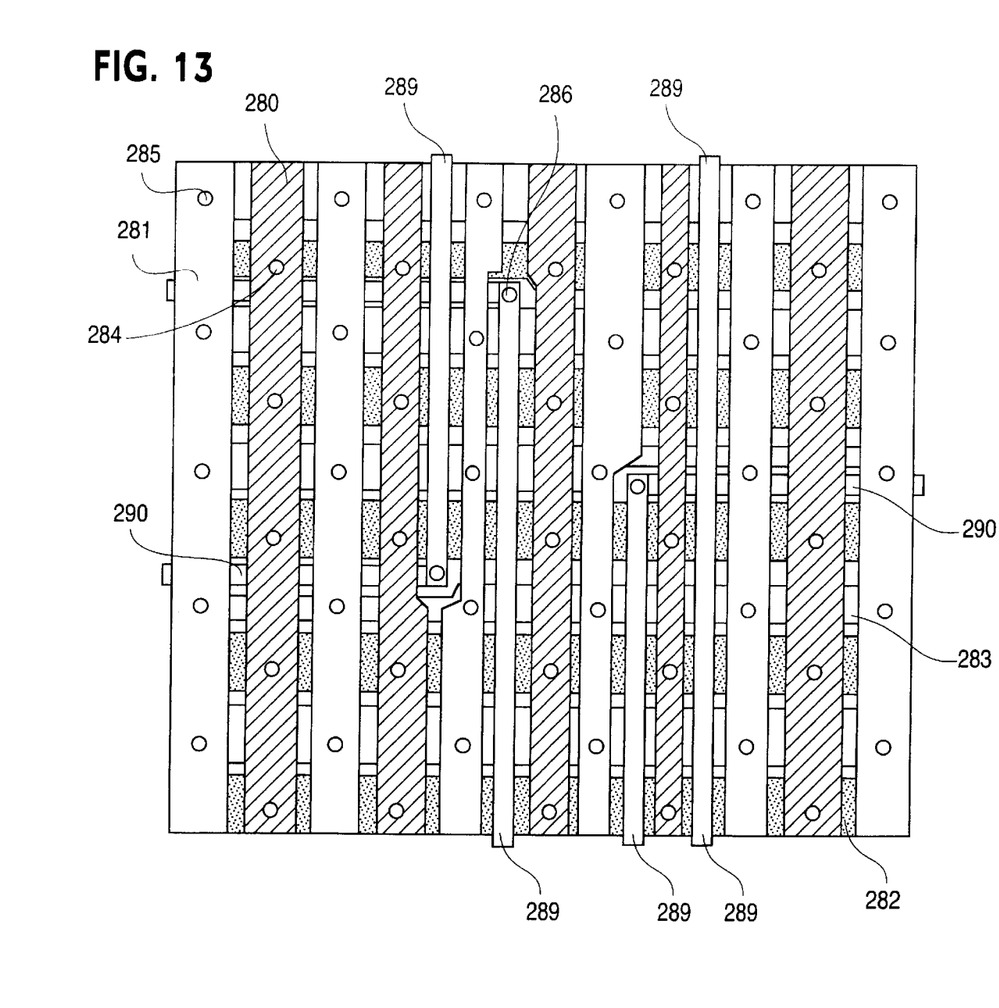
FIG. 13 illustrates the mesh plane of FIG. 12 having areas carved away to form spaces separating ground conductors, power conductors and signal conductors.

The present invention also provides an improved MCM, as illustrated in FIG. 13. This MCM can be formed by a method shown in various stages in FIGS. 11–13. FIG. 11 shows an initial dual overlapping mesh structure including alternating X ground conductors 282 and X power conductors 283 arranged in a first layer, and including alternating Y ground conductors 280 and Y power conductors 281 arranged in a second layer. The conductors 280, 281, 282, 283 are relatively wide so that edges of adjacent X conductors 282, 283 touch each other and edges of adjacent Y conductors 280, 281 touch each other. The conductors 280, 281, 282, 283 could be, for example, 80 $\mu$m wide, giving conductors of like direction and polarity in a 160 $\mu$m pitch.

Turning to FIG. 12, desired areas representing X signal conductors 290 and Y signal conductors 289 are defined (shown in cross-hatch), respectively, along selected touching borders of adjacent X conductors 282, 283 and adjacent Y conductors 280, 281. After the areas have been defined, surrounding spaces are carved out, as shown in FIG. 13, forming the signal conductors 289, 290 and also forming spaces between adjacent power conductors 281, 283 and ground conductors 280, 282. Each signal conductor 289, 290 is centrally positioned on a longitudinal axis defined by initially touching borders between adjacent conductors 282, 283 or 280, 281.

As in the previous embodiments, vias 284 join junctions of overlapping ground conductors 280, 282, vias 285 join overlapping power conductors 281,283, and vias 286 join selected junctions of X and Y signal conductors 289,290. The vias 284,285 can be provided at some later stage, such as after the spaces have been removed and the signal lines inserted.

Figure 15:
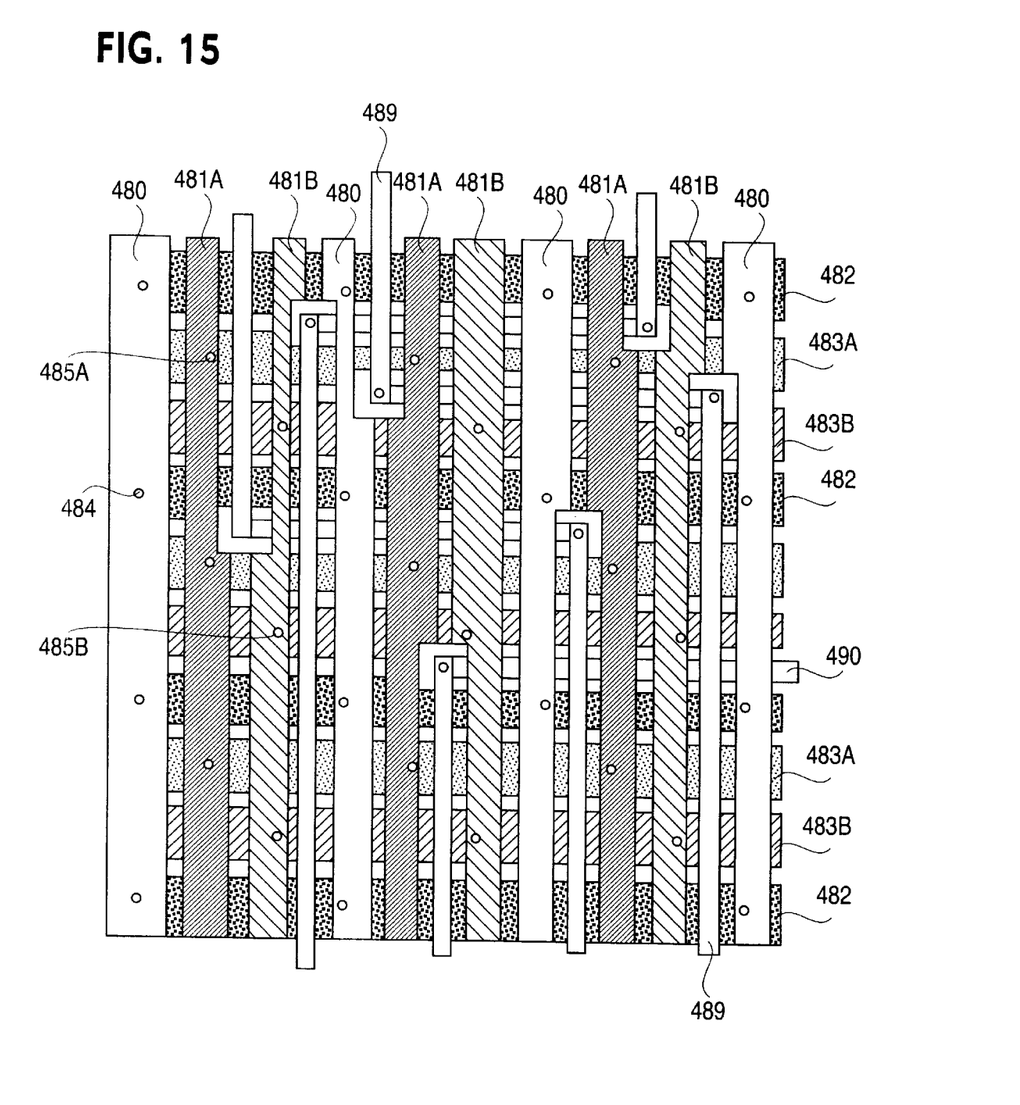

Yet another embodiment of the present invention provides a power plane with more than two voltage levels. Whereas the previously discussed embodiments had one mesh of ground conductors and one mesh of power conductors to supply a single predetermined voltage, an MCM can be formed having a second set of power conductors providing another voltage. FIG. 15 illustrates such an MCM.

Figure 14:
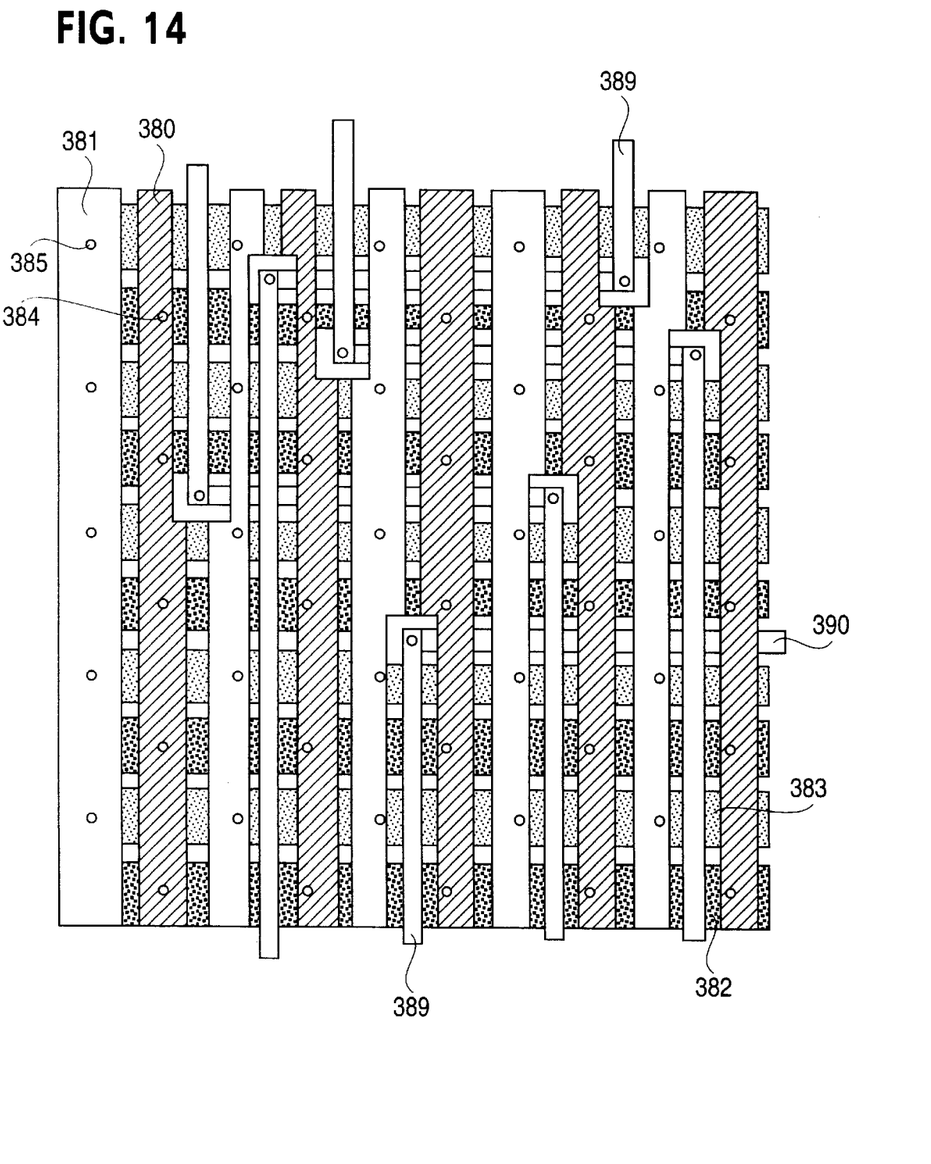
FIGS. 14 and 15 illustrate mesh planes of like structure but having differently located vias, the embodiment of FIG. 14 having a single power mesh, the embodiment of FIG. 15 having dual power meshes.

FIGS. 14 and 15 illustrate how two embodiments can be made from identical conductor patterns, but having differently located vias. Specifically, the embodiment of FIG. 14 has a single power mesh, like the embodiment of FIG. 13, while the embodiment of FIG. 15 has dual power meshes, which can be provided with different voltages, e.g., 5V and 3.3V.

The embodiment of FIG. 14 has a single power mesh including X and Y power conductors 383 and 381, respectively, interconnected by suitably located vias 385. A ground mesh is provided including X and Y ground conductors, 382 and 380, respectively, interconnected by suitably located vias 384. X and Y signal conductors 390 and 389 are provided at selected paths generally therebetween.

The embodiment of FIG. 15 has a first power mesh including first X and Y power conductors 483A and 481A, respectively, interconnected by vias 485A, and a second power mesh including second X and Y power conductors 483B and 481B, respectively, interconnected by vias 485B. A ground mesh is also provided including X and Y ground conductors, 482 and 480, respectively, interconnected by vias 484. X and Y signal conductors 490 and 489, respectively, are provided at selected paths generally therebetween.

The signal conductors in FIGS. 14 and 15 (390,389 and 490,489, respectively) could be, for example, 20 $\mu$m wide on an 80 $\mu$m pitch. The various power conductors can be 20 $\mu$m, 40 $\mu$m, or 60 $\mu$m wide at various portions depending on the proximity to the signal lines, being spaced at an 80 $\mu$m pitch. In a CAD formation process, the power distribution meshes can be formed by the methods described above. For example, either mesh could be formed by the "filling in" method described in conjunction with FIGS. 8–10, i.e. providing initial layers of 20 $\mu$m wide conductor lines, cutting selected lines to define signal conductors, then "filling in" space between desired power and ground conductors. Alternatively, the embodiments of either FIG. 14 or 15 could be formed by the "cutting away" method described in conjunction with FIGS. 11–13, i.e. providing an initial arrangement of 80 $\mu$m wide conductor lines and removing material from desired areas. It is recognized that the placement of vias constitutes the difference between the embodiments of FIGS. 14 and 15. Part of the design method could include providing an initial phantom composite mesh of 20 $\mu$m lines so that proper placement of the ultimate components thereon could be accurately estimated.

It should be understood that various changes and modifications to the presently preferred embodiments will be apparent to those skilled in the art. For example, the placement of the various conductors could be effected using a desired pattern or dimension other than those shown and discussed herein. Furthermore, an electrical interconnection medium according to the present invention could include more than two power meshes. Such changes and modification can be made without departing from the spirit and scope of the present invention and without diminishing its attendant advantages. It is, therefore, intended that such changes and modifications be covered by the appended claims.

What is claimed is:

1. An electrical interconnection medium, comprising:
   a plurality of mesh-plane conductors disposed and connected so as to form at least one offset electrical mesh plane; and
   a plurality of signal conductors disposed among the mesh-plane conductors within at least one layer of the mesh plane,
   wherein one or more mesh-plane conductors in said layer vary in width, such that at least one mesh-plane conductor in said layer is narrowed wherever at least one signal conductor is adjacent thereto.

2. The electrical interconnection medium according to claim 1, wherein the mesh-plane conductors are disposed and connected so as to form a plurality of offset electrical mesh planes.

3. The electrical interconnection medium according to claim 2, wherein said plurality of mesh planes are interdigitated.

4. The electrical interconnection medium according to claim 1, wherein one or more mesh-plane conductors vary in width as aforesaid in each layer of the mesh plane.

5. The electrical interconnection medium according to claim 1, wherein at least one mesh-plane conductor in said layer has a first portion adjacent to two signal conductors, a second portion adjacent to a signal conductor and another mesh-plane conductor, and a third portion adjacent to two other mesh-plane conductors; and wherein a width of said first portion is narrower than a width of said second portion, and the width of said second portion is narrower than a width of said third portion.

6. The electrical interconnection medium according to claim 1, wherein said layer includes signal conductors arranged at twice a minimum conductor pitch of said layer, where said minimum conductor pitch is equal to the sum of a minimum conductor width and a minimum inter-conductor spacing of said layer.

7. The electrical interconnection medium according to claim 1, further comprising at least one pad for making an electrical connection to the mesh plane from the exterior.

8. The electrical interconnection medium according to claim 7, wherein said pad is disposed in a layer of the mesh plane.

9. The electrical interconnection medium according to claim 7, wherein said pad is connected to a mesh-plane conductor in another layer of the mesh plane by way of at least one via.

10. The electrical interconnection medium according to claim 7, wherein said pad is connected to a mesh-plane conductor of the mesh plane by way of at least one via.

11. The electrical interconnection medium according to claim 1, wherein the mesh plane includes mesh-plane conductors disposed on opposite sides of a substrate.

12. An electronic device including an electrical interconnection medium according to claim 1.

13. An electronic device according to claim 12, and which is constituted by one of a multichip module, a printed wiring board, and a semiconductor device.

14. An electrical interconnection medium, comprising:
   a substrate;
   a first plurality of mesh-plane conductors disposed on one side of said substrate; and
   a second plurality of mesh-plane conductors disposed on an opposite side of said substrate,
   wherein mesh-plane conductors of said first plurality are connected to mesh-plane conductors of said second plurality so as to form at least one offset electrical mesh-plane.

* * * * *